United States Patent
Sutardja

(10) Patent No.: US 7,423,901 B2
(45) Date of Patent: Sep. 9, 2008

(54) CALIBRATION SYSTEM FOR WRITING AND READING MULTIPLE STATES INTO PHASE CHANGE MEMORY

(75) Inventor: Pantas Sutardja, Los Gatos, CA (US)

(73) Assignee: Marvell World Trade, Ltd., St. Michael (BB)

(*) Notice: Subject to any disclaimer, the term of this patent is extended or adjusted under 35 U.S.C. 154(b) by 36 days.

(21) Appl. No.: 11/701,338

(22) Filed: Feb. 1, 2007

(65) Prior Publication Data

US 2007/0206410 A1    Sep. 6, 2007

Related U.S. Application Data

(60) Provisional application No. 60/778,716, filed on Mar. 3, 2006.

(51) Int. Cl.
G11C 11/00    (2006.01)

(52) U.S. Cl. .................................. 365/163; 365/148

(58) Field of Classification Search ............. 365/163
See application file for complete search history.

(56) References Cited

U.S. PATENT DOCUMENTS

| | | | | |
|---|---|---|---|---|
| 7,042,760 B2 * | 5/2006 | Hwang et al. | ............ | 365/163 |
| 7,283,387 B2 * | 10/2007 | Cho et al. | ............ | 365/163 |
| 2004/0094778 A1 * | 5/2004 | Ooishi | ............ | 257/202 |
| 2005/0117387 A1 * | 6/2005 | Hwang et al. | ............ | 365/163 |
| 2005/0117388 A1 | 6/2005 | Cho | | |
| 2005/0232014 A1 * | 10/2005 | Kund et al. | ............ | 365/185.18 |
| 2007/0255891 A1 * | 11/2007 | Chow et al. | ............ | 711/103 |

OTHER PUBLICATIONS

OVONYX—OUM—Ovonic Unified Memory; Dec. 1999; pp. 1-80.
PCT International Search Report and Written Opinion dated Aug. 21, 2007 for Application No. PCT/US2007/005450; 13 pages.
Feldbaumer, David et al; "Pulse Current Trimming of Polysilicon Resistors"; IEEE Transactions on Electron Devices, IEEE Service Center, Pisacataway, NJ, vol. 42, No. 4, Apr. 1, 1995; pp. 689-696.

* cited by examiner

Primary Examiner—Son L Mai

(57) ABSTRACT

A phase change memory system includes M phase change memory cells, where M is an integer greater than or equal to one. A write module selectively writes at least one of the M phase change memory cells based on a write parameter. A read module selectively reads back a resistance value for the at least one of the M phase change memory cells. A control module communicates with the write module and the read module and triggers write/read cycles N times where N is an integer greater than one. The control module also adjusts a write parameter of one of the N write/read cycles based on at least one prior resistance value and a target resistance value.

29 Claims, 14 Drawing Sheets ial Application No. 60/778,716, filed on Mar. 3, 2006. The disclosure of the above application is incorporated herein by reference in its entirety.

CALIBRATION SYSTEM FOR WRITING AND READING MULTIPLE STATES INTO PHASE CHANGE MEMORY

CROSS-REFERENCE TO RELATED APPLICATIONS

This application claims the benefit of U.S. Provisional Application No. 60/778,716, filed on Mar. 3, 2006. The disclosure of the above application is incorporated herein by reference in its entirety.

FIELD

The present disclosure relates to memory modules and, more particularly, to a calibration system for multi-state phase change memory.

BACKGROUND

The Background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Phase change materials have been proposed for use in memory devices. Phase change materials may be electrically programmed between various states. These states range from fully amorphous to fully crystalline. In a fully crystalline state, the phase change material exhibits a low resistance. In a fully amorphous state, the phase change material exhibits a high resistance. Phase change materials may be used as binary memories by varying the resistance of the phase change material.

Random access memory (RAM) utilizing phase change materials has competed unfavorably against other memory technologies, such as flash memory. This is because flash memory typically has a density that is 2-4 times greater than the densest phase change memory.

SUMMARY

A phase change memory system includes M phase change memory cells, where M is an integer greater than or equal to one. A write module selectively writes at least one of the M phase change memory cells based on a write parameter. A read module selectively reads back a resistance value for the at least one of the M phase change memory cells. A control module communicates with the write module and the read module and triggers write/read cycles N times where N is an integer greater than one. The control module also adjusts a write parameter of one of the N write/read cycles based on at least one prior resistance value and a target resistance value.

In other features, the control module comprises an estimation module that generates an $N^{th}$ write parameter based on N−1 resistance values corresponding to N−1 of the N write/read cycles and the target resistance value, and where N is greater than two. The estimation module interpolates the $N^{th}$ write parameter based on N−1 resistance values corresponding to N−1 of the N write/read cycles and the target resistance value. The estimation module extrapolates the $N^{th}$ write parameter based on N−1 resistance values corresponding to N−1 of the N write/read cycles and the target resistance value.

In other features, the estimation module generates a second write parameter for a second one of the write/read cycles. The second write parameter is based on a difference between a first resistance value from a first one of the write/read cycles and the target resistance value. The estimation module interpolates a subsequent resistance value based on the difference, a gradient value of the at least one of the M phase change memory cells, and the target resistance value. The estimation module extrapolates the target resistance value based on the difference, a gradient value of the at least one of the M phase change memory cells, and the target resistance value. The control module sets a write parameter of another one of the M phase change memory cells based on a last one of the write parameters for the at least one of the M phase change memory cells.

In other features, the write module writes the at least one of the phase change memory cells using a first write profile that heats the at least one of the phase change memory cells above a melting temperature. The first write profile also decreases the at least one of the phase change memory cells below a crystallization temperature that is below the melting temperature. The first write profile also heats the at least one of the phase change memory cells to the crystallization temperature and maintains the crystallization temperature for a first time period. The first time period of the first write profile corresponds to a first resistance value above the target resistance value.

In other features, the control module adjusts the first time period in a second write profile to provide a second resistance value below the first resistance value and above the target resistance value. The control module bases at least one of the write parameters on the first time period of the first and the second write profiles. The control module incrementally decreases a resistance value of the at least one of the phase-change memory cells based on the target resistance value using X current pulses, where X is an integer greater than one. The write parameters of the N write/read cycles correspond to N different crystallization times. The write parameters of the N write/read cycles correspond to N different crystallization temperatures.

In other features, a method for storing data in phase change memory includes selectively writing at least one of the M phase change memory cells based on a write parameter, where M is an integer greater than or equal to one. The method further includes selectively reading back a resistance value for the at least one of the M phase change memory cells. The method further includes triggering write/read cycles N times where N is an integer greater than one. The method further includes adjusting a write parameter of one of the N write/read cycles based on at least one prior resistance value and a target resistance value.

In other features, the method includes generating an $N^{th}$ write parameter based on N−1 resistance values corresponding to N−1 of the N write/read cycles and the target resistance value, where N is greater than two. The method further includes interpolating the $N^{th}$ write parameter based on N−1 resistance values corresponding to N−1 of the N write/read cycles and the target resistance value, where N is greater than two. The method further includes extrapolating the $N^{th}$ write parameter based on N−1 resistance values corresponding to N−1 of the N write/read cycles and the target resistance value.

In other features, the method includes generating a second write parameter for a second one of the write/read cycles based on a difference between a first resistance value from a first one of the write/read cycles and the target resistance value. The method further includes interpolating a subsequent resistance value based on the difference, a gradient value of the at least one of the M phase change memory cells, and the target resistance value. The method further includes extrapolating the target resistance value based on the difference, a gradient value of the at least one of the M phase change memory cells, and the target resistance value. The method includes setting a write parameter of another one of the M phase change memory cells based on a last one of the write parameters for the at least one of the M phase change memory cells.

In other features, the method includes heating the at least one of the phase change memory cells above a melting temperature. The method further includes decreasing temperature of the at least one of the phase change memory cells below a crystallization temperature that is below the melting temperature. The method further includes heating the at least one of the phase change memory cells to the crystallization temperature. The method further includes maintaining the crystallization temperature for a first time period.

In other features, the method includes adjusting the first time period in a second write profile to provide a second resistance value below a first resistance value and above the target resistance value. The first time period of the first write profile corresponds to the first resistance value above the target resistance value. The method further includes generating at least one of the write parameters based on the first time period of the first and the second write profiles. The method further includes incrementally decreasing a resistance value of the at least one of the phase-change memory cells based on the target resistance value using X current pulses, where X is an integer greater than one.

In other features, a phase change memory system includes M phase change memory cells, where M is an integer greater than or equal to one. The system also includes write means for writing selectively to at least one of the M phase change memory cells based on a write parameter. The system also includes read means for reading back a resistance value selectively for the at least one of the M phase change memory cells. The system also includes control means for triggering write/read cycles N times where N is an integer greater than one. The control means also adjusts a write parameter of one of the N write/read cycles based on at least one prior resistance value and a target resistance value. The control means also communicates with the write means and the read means, In other features, the control means comprises estimation means for generating an $N^{th}$ write parameter based on N−1 resistance values corresponding to N−1 of the N write/read cycles and the target resistance value. N is greater than two. The estimation means interpolates the $N^{th}$ write parameter based on N−1 resistance values corresponding to N−1 of the N write/read cycles and the target resistance value. The estimation means extrapolates the $N^{th}$ write parameter based on N−1 resistance values corresponding to N−1 of the N write/read cycles and the target resistance value. The estimation means generates a second write parameter for a second one of the write/read cycles based on a difference between a first resistance value from a first one of the write/read cycles and the target resistance value.

In other features, the estimation means interpolates a subsequent resistance value based on the difference, a gradient value of the at least one of the M phase change memory cells, and the target resistance value. The estimation means extrapolates the target resistance value based on the difference, a gradient value of the at least one of the M phase change memory cells, and the target resistance value. The control means sets a write parameter of another one of the M phase change memory cells based on a last one of the write parameters for the at least one of the M phase change memory cells.

In other features, the write means writes the at least one of the phase change memory cells using a first write profile that heats the at least one of the phase change memory cells above a melting temperature. The first write profile decreases the at least one of the phase change memory cells below a crystallization temperature that is below the melting temperature. The first write profile also heats the at least one of the phase change memory cells to the crystallization temperature and maintains the crystallization temperature for a first time period.

In other features, the first time period of the first write profile corresponds to a first resistance value above the target resistance value. The control means adjusts the first time period in a second write profile to provide a second resistance value below the first resistance value and above the target resistance value. The control means bases at least one of the write parameters on the first time period of the first and the second write profiles. The control means incrementally decreases a resistance value of the at least one of the phase-change memory cells based on the target resistance value using X current pulses, where X is an integer greater than one. The write parameters of the N write/read cycles correspond to N different crystallization times. The write parameters of the N write/read cycles correspond to N different crystallization temperatures.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
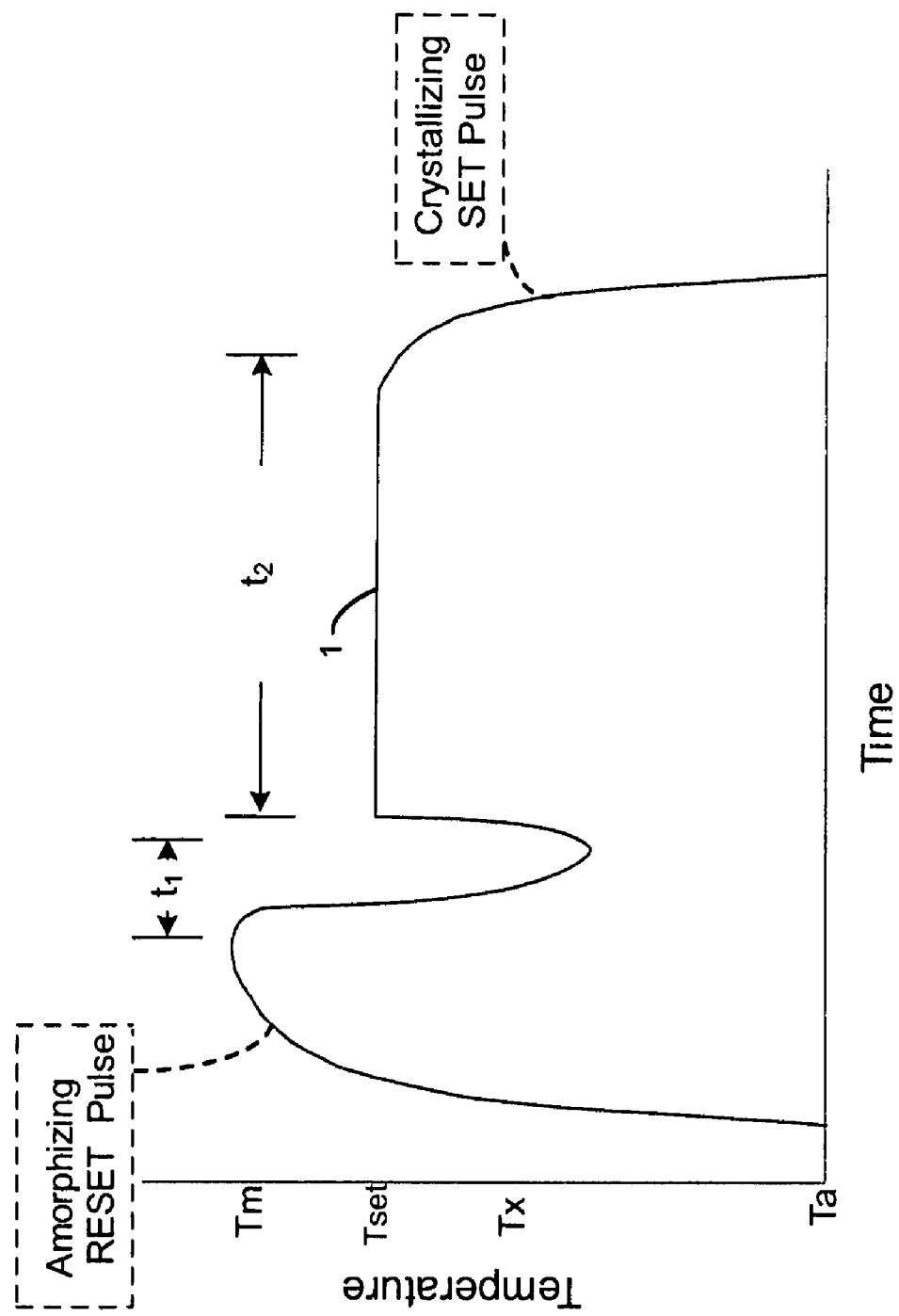
FIG. 1 is graph of a temperature profile for a phase change material.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. It should be understood that steps within a method may be executed in a different order without altering the principles of the present disclosure.

Most memory technologies are limited to N=2 states. However, in addition to binary storage of data with N=2 states, phase change materials can store additional states (N>2) that can be used to further increase data storage density. The additional states are obtained by interim resistance values between the low and high values corresponding to fully crystalline and fully amorphous states, respectively. For example with N=4, two bits can be stored per cell.

The present disclosure is directed to systems and methods for accurately writing and reading multi-level values into a memory array including phase change memory cells. The memory array may be used in electronic devices including portable electronic devices, such as cell phones, laptop computers, personal digital assistants (PDAs), hand-held gaming devices, portable music players, portable video players, and the like.

A memory module may perform calibration of the phase change memory cells in the array for each write operation. Calibration may include writing a cell with a first write profile, writing the cell with a second write profile and comparing the resulting cell resistance values to a predetermined resistance value (i.e. optimal target resistance value). A target write profile may be based on the comparison. The target write profile may be used to write a target resistance value into the cell that may differ from the optimal target resistance value. The target resistance value may be incrementally decreased to approach the optimal target resistance. Calibration according to the present disclosure enables programming of multiple resistance levels into phase change memory cells of the memory array, which allows storage of more than one bit per cell. This, in turn, increases storage density.

Referring now to FIG. 1, a phase change memory cell including a phase change material such as chalcogenide alloy can be programmed using a temperature profile 1. On the left side of the temperature profile 1, the phase change material remains in a substantially constant high resistance state until a sufficient current pulse (RESET pulse) is applied. During the RESET pulse, the temperature of the phase change material is raised above a melting temperature ($T_m$) and allowed to quench or cool down quickly in an amorphous state. In other words, the temperature of the phase change material is brought below a crystallization temperature (Tx) during a time period ($t_1$).

On the right side of the profile 1, a SET pulse programs the memory cell from the high resistance amorphous state to the low resistance crystalline state. The SET pulse heats the phase change material to a temperature Tset that is below Tm but above Tx. A prolonged period ($t_2$) at Tset allows the material to re-order to the crystalline state. The length of $t_2$ may determine the extent of crystallization.

If the phase change material is annealed at a temperature other than Tset, intermediate resistance values between the crystalline and amorphous state can be obtained. As annealing temperature increases, relative resistance tends to decrease. Further, because partial crystallization is possible, control of crystallization time during a write process allows multi-level writing. In other words, each cell can store additional states and N can be greater than 2.

While a write current pulse and duration controls a temperature profile, there may be at least two limitations. First, process, material, and pattern formation non-uniformities can cause the memory cells to have slightly different programmed resistance values for a given temperature profile (or write parameter). Second, with resistance changes over several orders of magnitude, it may be difficult to read-back the resistance value with sufficient dynamic range and accuracy.

Figure 2:
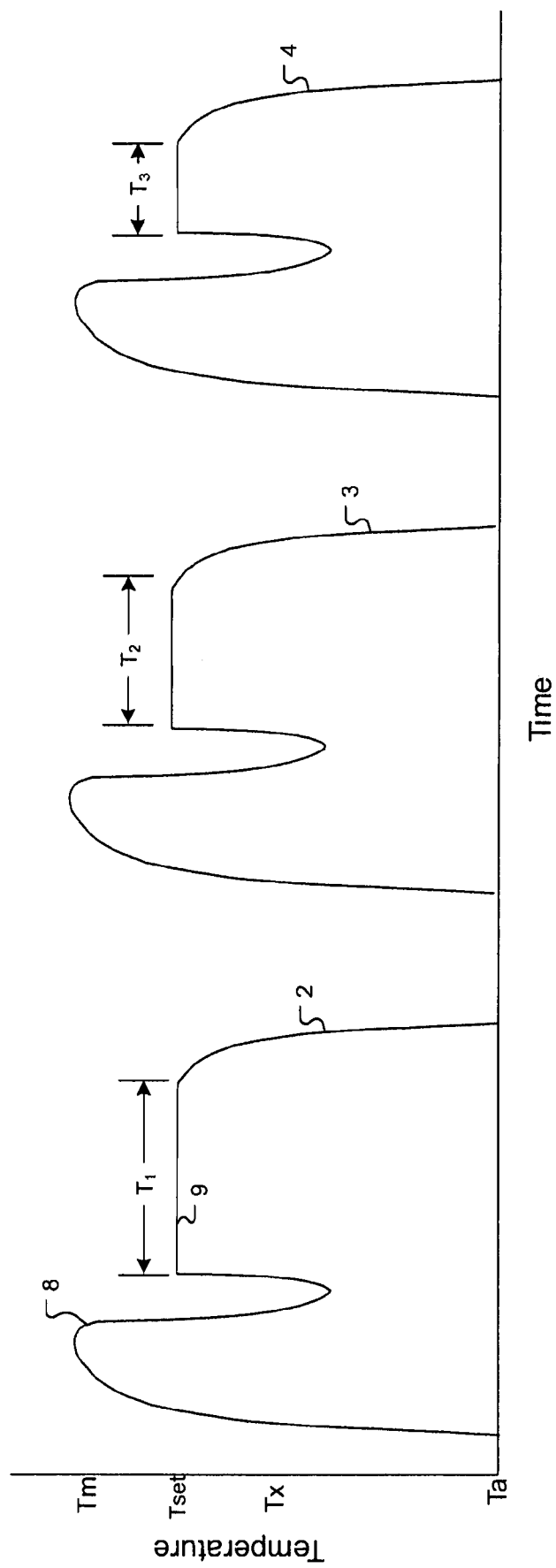
FIG. 2 is graph of temperature profiles for a phase change material.
Figure 3:
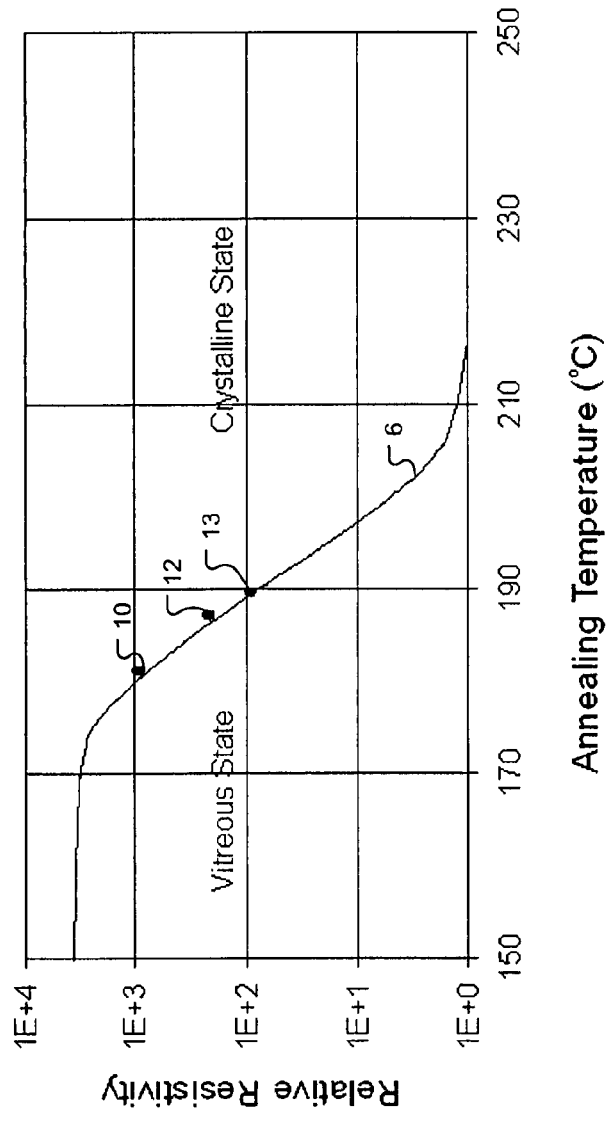
FIG. 3 is a graph of relative resistance when an amorphous state phase change material is annealed.
Figure 4:
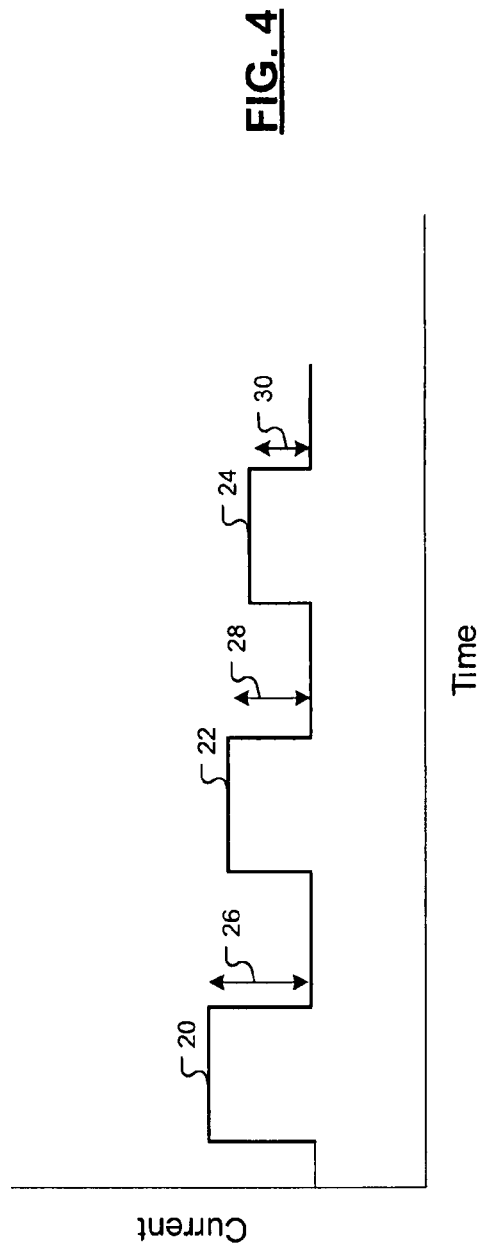
FIG. 4 is a graph of incrementally decreasing write pulses.

Referring now to FIGS. 2, 3, and 4, to calibrate memory cells, interpolation and/or extrapolation may be used for each write operation. Crystallization time and/or temperature maybe varied to calibrate the cell so that it approaches a predetermined or optimal target resistance. In FIG. 2, temperature profiles 2, 3, 4 including successively decreasing crystallization times, $T_1$, $T_2$, and $T_3$ respectively, are illustrated. A curve 6 in FIG. 3 illustrates different resistivities corresponding to crystallization temperatures $T_1$, $T_2$, and $T_3$.

Following the erase/write operations 8, 9 of the first profile 2, a difference between the resulting resistance 10 of the material and the optimal target resistance is measured. Crystallization time of the second profile 3 is reduced based on the difference resulting in resistance 12. A difference between the resulting resistance 12 of the material and the optimal target resistance is measured.

The third profile 4 results in a third resistance 13 that may correspond to the optimal target resistance for the material. The temperature profile 4 may be based on interpolation and/or extrapolation of the resistance differences and may include a shorter crystallization time than profiles 2, 3. $T_1$ and $T_2$ of profiles 2, 3 may be chosen above an estimated crystallization time for the memory cell. $T_1$ may be based on a optimal target resistance ($R_{target}$) plus a resistance above the optimal target resistance ($\Delta R$), and $T_2$ may be between $T_1$ and a crystallization temperature for the optimal target resistance.

In FIG. 4, incremental write pulses 20, 22, 24 may be used to incrementally adjust the resistance 13 closer to the optimal target resistance. Pulse height corresponds to temperature applied to the cell. Successive heights 26, 28, 30 of the incremental write pulse 20, 22, 24 are measured in view of a resulting resistance value of the memory cell. As the resistance approaches the optimal target resistance, the pulses 20, 22, 24 are reduced.

Figure 5A:
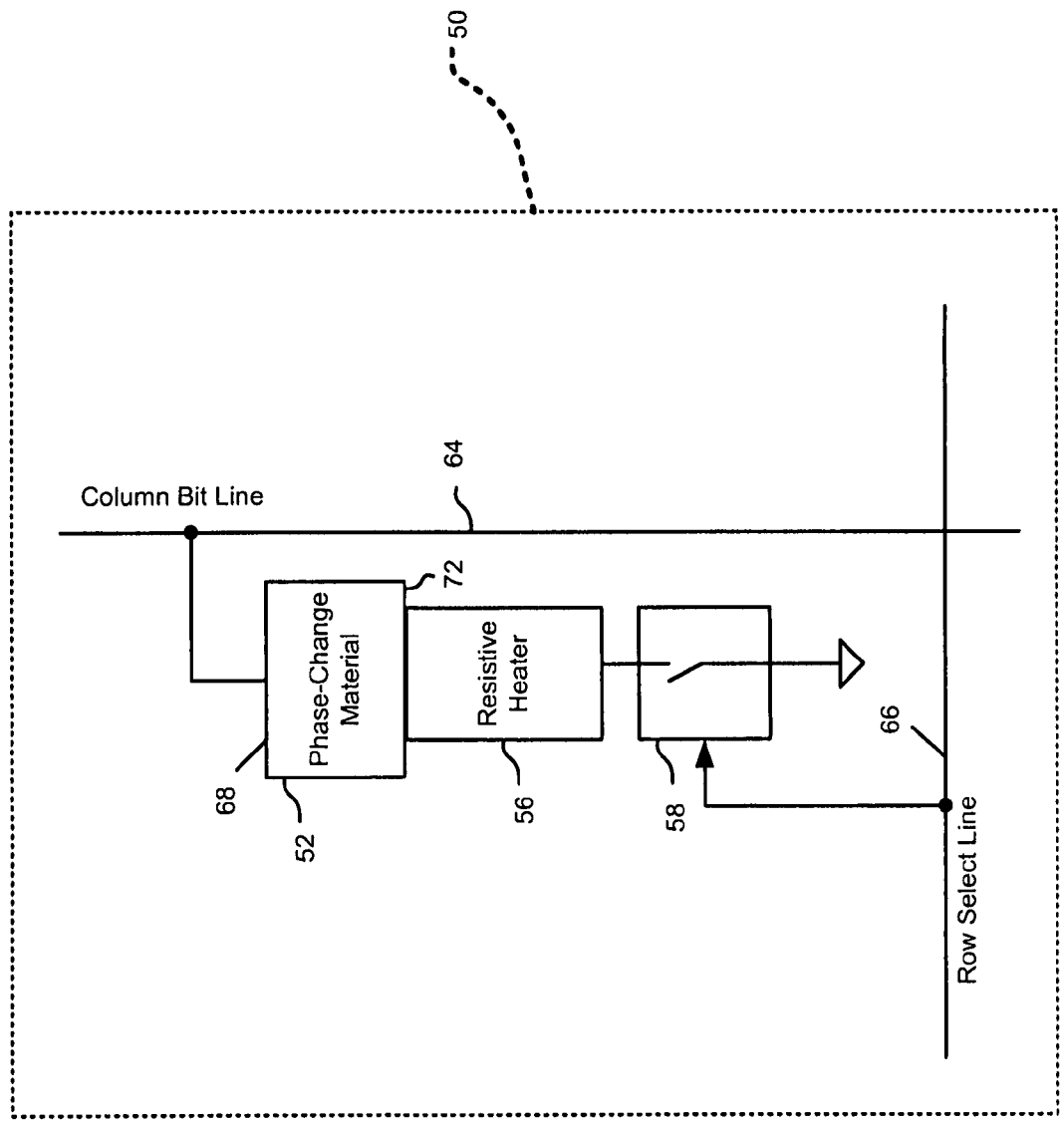
FIG. 5A is a functional block diagram of an exemplary phase change memory cell.
Figure 5B:
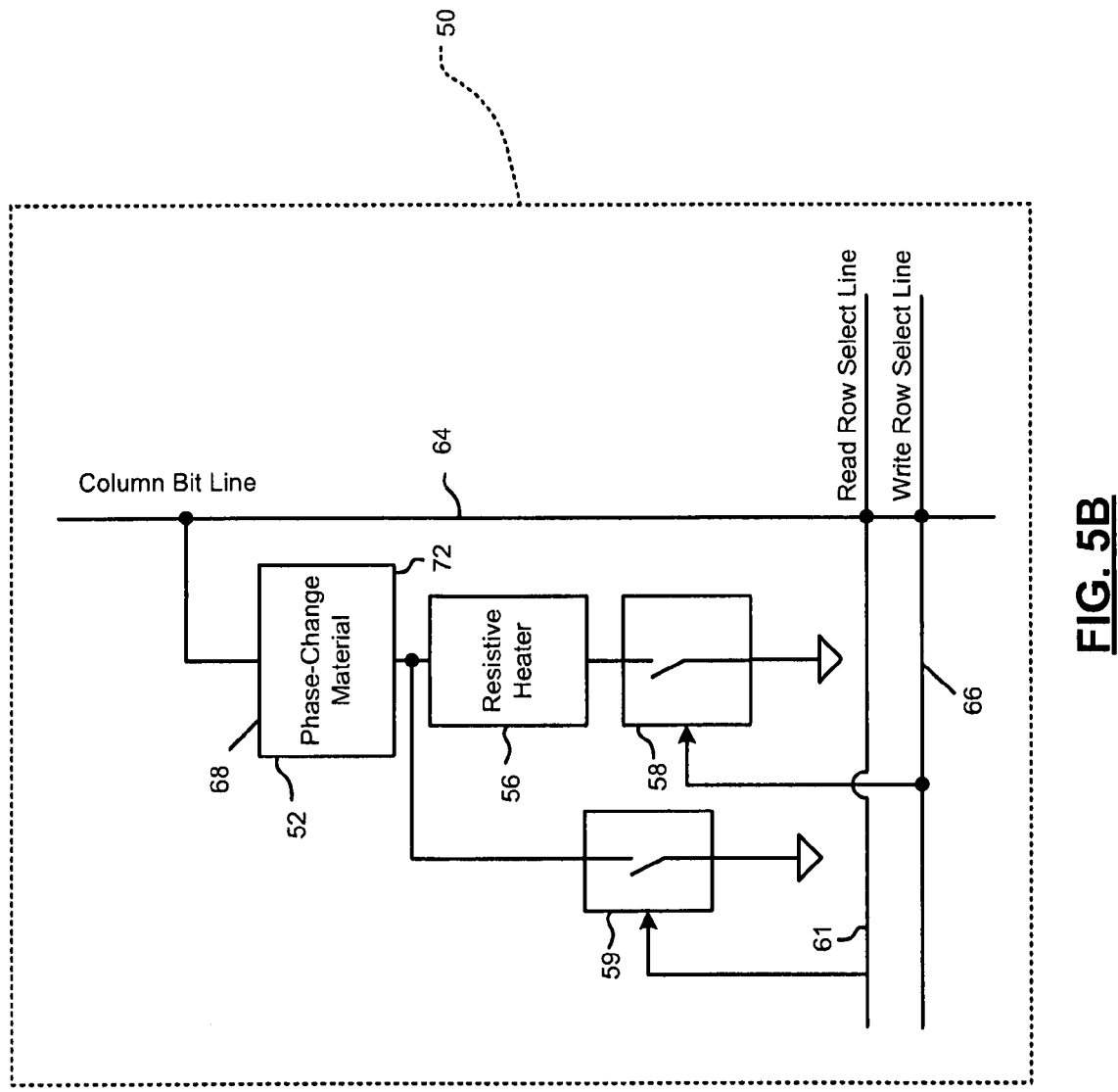
FIG. 5B is a functional block diagram of another phase change memory cell.
Figure 6:
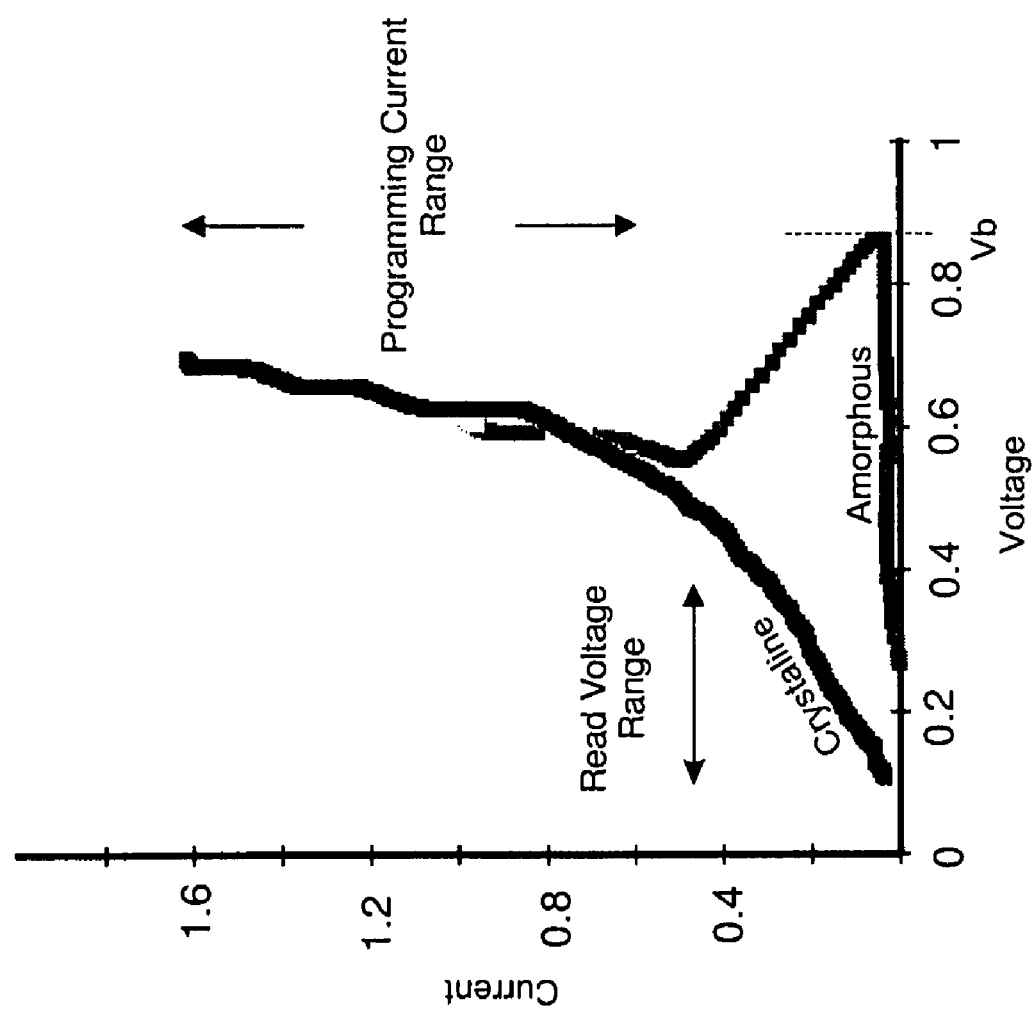
FIG. 6 is a graph of current and voltage characteristics of a phase change material.

Referring now to FIGS. 5A, 5B, and 6, exemplary memory cells are illustrated. In FIG. 5A, a memory cell 50 includes a phase change material 52. A heater 56 and a select switch 58 are connected in a row and column orientation. The heater 56 can be a resistive heater. The memory cell 50 may be located at an intersection of a column bit line 64 and row select line 66. One end 68 of the material 52 is connected to the column bit line 64. Another end 72 is connected to the resistive heater 56, which is selectively connected by the switch 58 to a reference potential such as ground. The switch 58 is controlled by the row select line 66. The resistive heater 56 may include an inert electrical heater cell.

Referring now to FIG. 5B, another select switch 59 may be controlled by a read row select line 61. This approach eliminates the resistive heater 56 from a read operation but increases cell size. Reading the phase change memory cell may include applying current and/or measuring voltage to determine resistance.

Referring now to FIG. 6, current and voltage (I/V) characteristics of a phase change material are shown. In addition, the I/V characteristic curve shows read voltage and write current ranges. Due to material break-down characteristics, a substantial amount of current may be conducted by applying a voltage exceeding the breakdown voltage ($V_b$) of the material. Current flowing through the material may be adjusted to control heating.

A rise in temperature from both heating and power dissipated within the phase change material provides controlled temperature cycling used for writing the phase change memory cell. Because of the break-down characteristics of the phase change material, the read-back process may be performed at an applied voltage lower than the breakdown voltage.

Figure 7A:
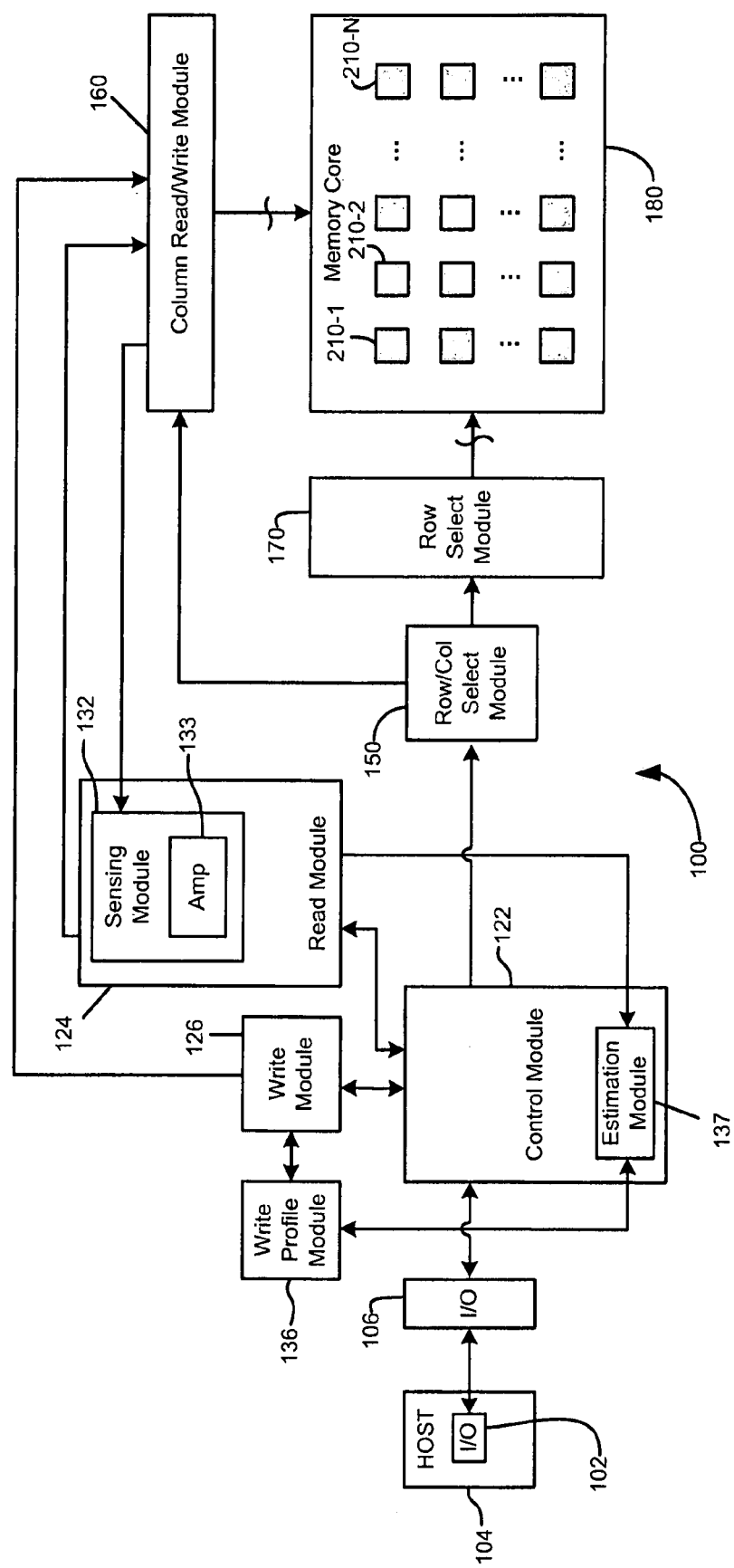
FIG. 7A is a functional block diagram of an exemplary memory module including calibration.
Figure 7B:
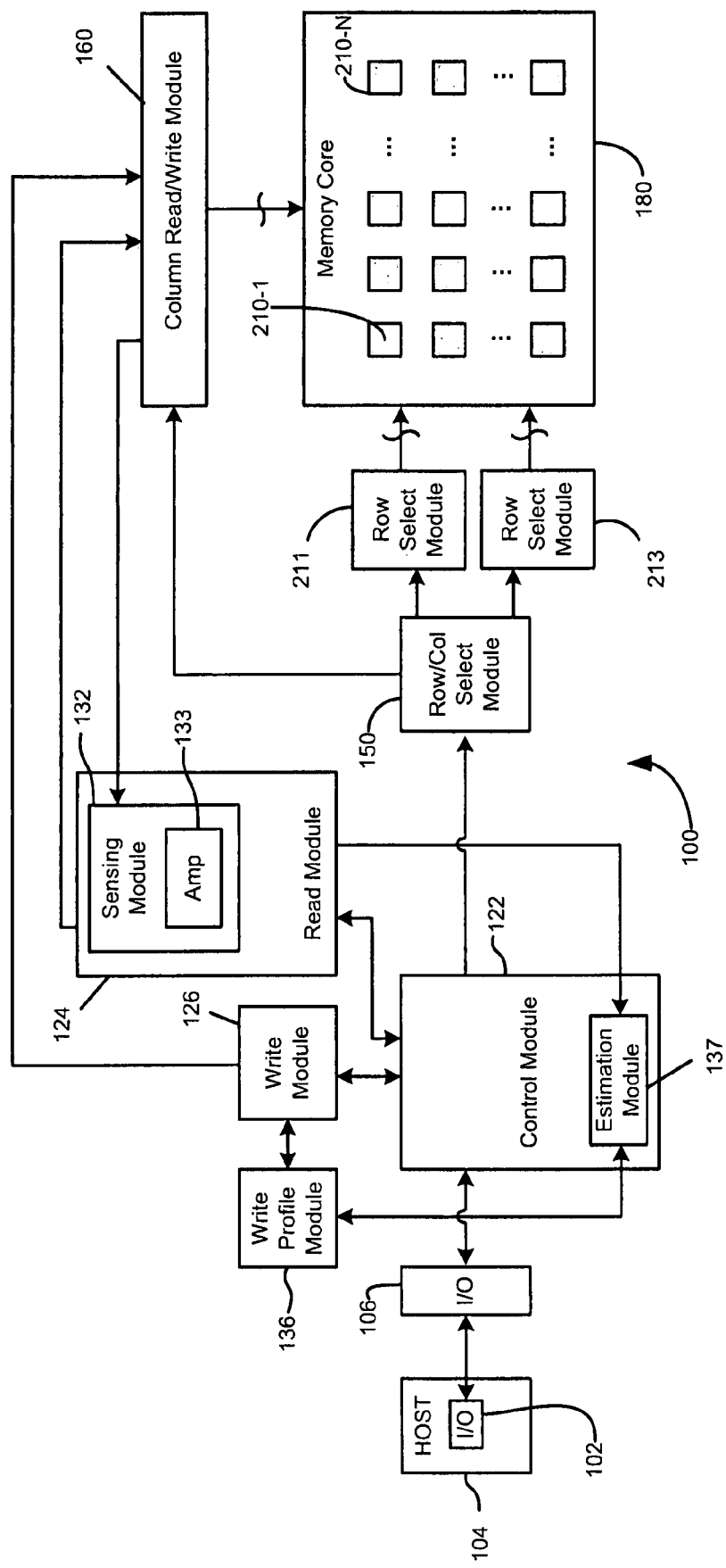
FIG. 7B is a functional block diagram of an exemplary memory module including calibration.

Referring now to FIGS. 7A and 7B, a memory module 100 or phase change memory system is illustrated. The memory module 100 is capable of being read from and written to by an input/output (I/O) module 102 of a host device 104 through a memory I/O module 106. The memory module 100 typically includes a memory core 180. The memory core 180 includes multiple phase change memory cells 210-1, 210-2, ..., 210-N (collectively 210). The memory cells 210-1, 210-2, ..., 210-N hold the data to be stored. Each of the memory cells may be programmable to a plurality of resistance states.

A control module 122 receives control signals from the host device 104 and controls a read module 124, a write module 126, and a row/column select module 150. Further, the control module 122 includes an estimation module 137, as will be described below. The row/column select module 150 outputs select signals to a column read/write module 160 and a row select module 170 to select one or more phase change memory cells 210 in the array. In FIG. 7B, the row select module 170 is split into a read row select module 211 controlling reading stored cell data and a write row select module 213 controlling heating of memory cell phase change materials During a write operation, the control module 122 instructs the row/column select module 150 (and the column and row select modules 160 and 170) to select write target cells for the write procedure. The target cells may include any number of cells, such as a particular cell, a row of cells, a column of cells, a block of cells, etc. Once the target cells are selected, the control module 122 instructs the write module 126 to generate a write signal having a first parameter. The write target cells are written to using the first parameter. The first parameter may be a default value for the initial write process. Alternately, the first parameter may be stored in a write profile module 136 and may be unique for each cell, and group of cells, etc. Once the write target cells have been written, additional target cells may be identified and written.

The estimation module 137 compares read back values for the target cells and may generate a second write parameter based on the first write parameter and the comparison. The second write parameter may be stored in the write profile module 136. The read back value may be compared with a predetermined threshold. The second write parameter may be determined based upon the first write parameter, the read back values and/or the comparison. The write and read process may be repeated as necessary.

The write process may include heating the phase change memory cells to a melting temperature and cooling the phase change memory cells to a crystallization temperature based on the first parameter. The first parameter may include a crystallization time or a crystallization temperature.

The estimation module 137 determines the extent to which the read back value matches a predetermined threshold. When the control module 122 finds the cell resistance within an acceptable threshold of the optimal target value, the first write parameter is used. If outside of an acceptable threshold, the estimation module 137 generates the second write parameter and/or a target write parameter using any suitable method. For example, interpolation and/or extrapolation may be used.

During a read operation, the control module 122 instructs the row/column select module 150 to select read target cells for the read procedure. The read target cells may include any number of cells, such as a particular cell, a row of cells, a column of cells, a block of cells, etc. Once the read target cells are selected, the control module 122 instructs the read module 124 to generate a read signal. A sensing module 132 in the read module 124 senses the stored value in the target cells. The sensing module 132 may include one or more amplifiers 133. In some implementations, the amplifiers 133 may have a logarithmic transfer function as will be described further below.

Figure 8:
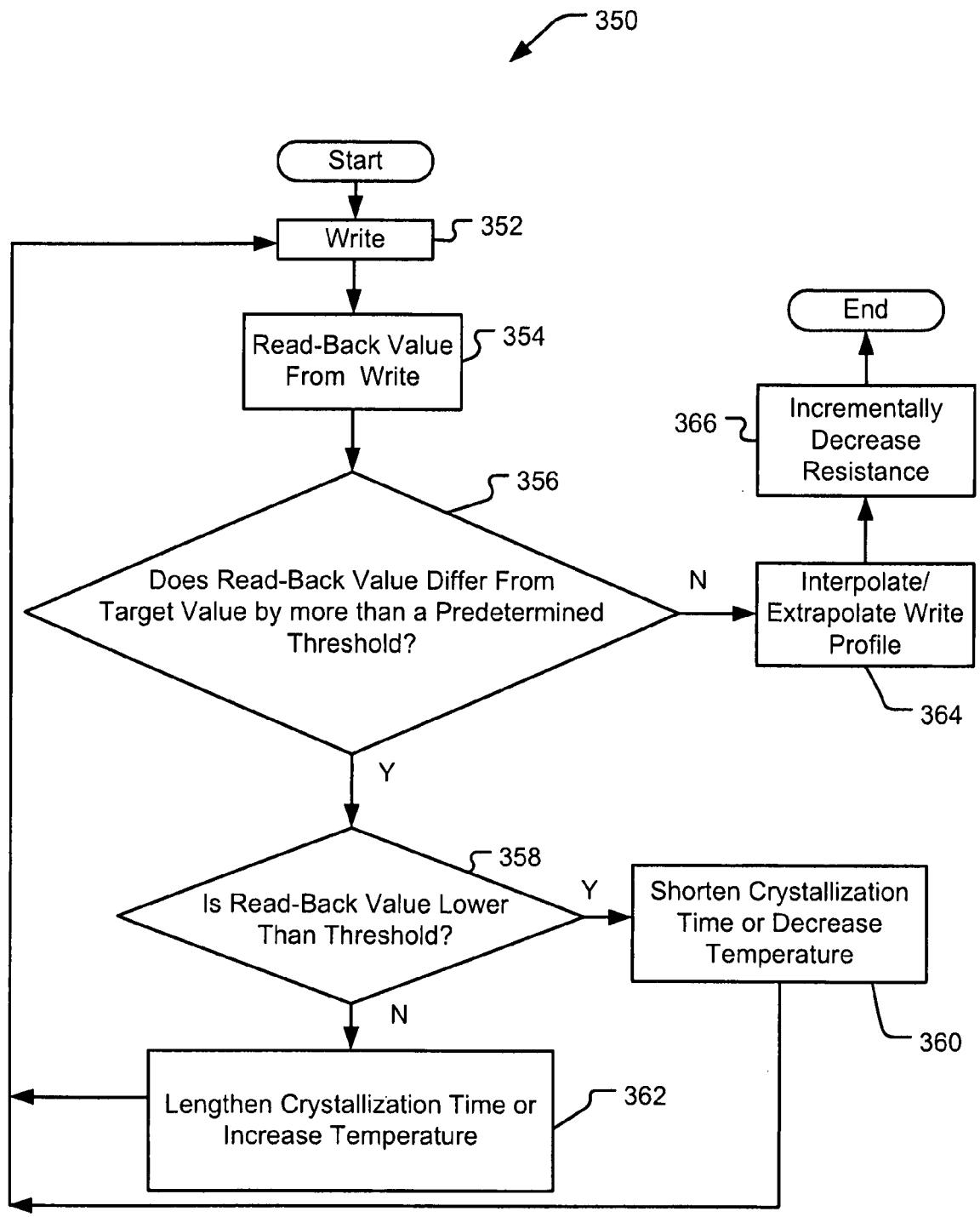
FIG. 8 illustrates steps of a method for writing and reading multi-level values into the memory module of FIGS. 7A and 7B.

Referring now to FIG. 8, a method 350 for controlling a multi-level phase change memory system including an array of phase change memory cells is illustrated. In step 352, a first write process is performed for one or more of the phase change memory cells within the system based on a first parameter. The first parameter may be a predetermined crystallization time or temperature associated with a target data value. A write waveform profile from a precalibrated write parameter table or equation may be used as first parameter so that it is nominally correct for a majority of the phase change memory cells. A second activation of step 352 generates a second write process using a second profile (for example temperature profile 3 in FIG. 2) having a different crystallization time and/or temperature than the first profile.

In step 354, values within the cell or cells from the write process of step 352 may be read back using a read-back amplifier. A determination is then made in step 356 whether the read-back values of step 354 differ from respective predetermined optimal target values by more than a predetermined threshold. The threshold may depend on memory cell parameters and a degree of accuracy required by the system. A comparison may be based on a resistance value within a portion of at least one phase change memory cell and the predetermined optimal target value.

In step 358, a determination is made whether the read-back value is lower than the optimal target value. For a positive response, in step 360, crystallization time of the phase change material within the cells is shortened, crystallization temperature is decreased, or a combination of the aforementioned is implemented. For example, the second profile discussed regarding FIG. 2 illustrates a shortened crystallization time in relation to the first profile. Other approaches can also be used. Otherwise, in step 362, crystallization time of the phase change material within the cells is lengthened, crystallization temperature is increased, or a combination of the aforementioned is implemented. Step 362 may be eliminated when the crystallization time and/or temperature for one write operation is deliberately chosen higher than the target value by the control module and merely reduced for each successive write profile. In response to steps 360 and 362, control returns to step 352.

For step 356 true, a target write profile is interpolated and/or extrapolated from previous write profiles in step 364. Resistance values resulting from previous write profiles are compared with the predetermined optimal target resistance for the interpolations and/or extrapolations. In step 366, incrementally decreasing write pulses may refine a target resistance resulting from the target write profile. The memory control module may check the memory cell following each incremental pulse and may determine whether the memory cell is sufficiently close to the optimal target resistance.

In operation, during each new write of a memory cell, write profiles may be used that have decreasing crystallization times. The crystallization times are chosen above a typical or predetermined time for crystallization to an optimal target resistance. A target profile may be based on interpolation/extrapolation of cell resistances resulting from the write profiles as compared with the optimal target resistance. Cell resistance resulting from the target profile may be incrementally adjusted down to more closely resembles the optimal target resistance. The memory control module 122 may check the memory cell following each incremental adjustment.

As an illustrative example, where the crystallization time is used as the controlled parameter so that t21 is the crystallization time for the first write, logV1 is the read-back value after the first write, t22 is the crystallization time for the second write, logV2 is the read-back value after the second write, and logVtarget is the target read-back value; the crystallization time t23 can be determined to the first order using linear interpolation and extrapolation as:

$$t23 = t21 + \frac{(\log Vtarget - \log V1) \times (t21 - t22)}{(\log V1 - \log V2)}.$$ (Equation 1)

The write and read process can be repeated as many times as required to achieve a predetermined accuracy. One interpolation step, however, may be all that is needed for achieving accurate results. Further, the corrected write profile may be determined by using the gradient of t2 versus logV values described in a calibrated write table and simply performing a second write step using the following equation:

$$t22 = t21 + (\log Vtarget - \log V1) \times \left(\frac{d\log V}{dt2}\right).$$ (Equation 2)

A third write may be required for achieving a desired accuracy, and the third write process can be determined by analyzing the behavior of the first write and the second write processes and an interpolation between the first and second resistances and the target resistance.

To improve the read-detection performance further, read-back processes may be processed serially through the control module 122 using a trellis coded modulation (TCM) or iterative (for example, a low-density parity-check code (LDPC)) channel. The signal processing of the TCM channel may be corrected through a hard error correcting code.

Further, every written cell of the array of phase change memory cells may be read-back through the column read/write module 160 including an automatic gain control function and a level linearization function. The level linearization function includes an iterative decoding channel for signal processing. The iterative decoding channel functions with a low density parity code (LDPC) and is corrected through a hard error correcting code. Further, the hard error correcting code may include a Reed-Solomon (RS) code. Further, the column read/write module 160 may control future drift in cell resistance due to a high temperature condition through an automatic gain control (AGC) loop having a non-linear channel.

Figure 9A:
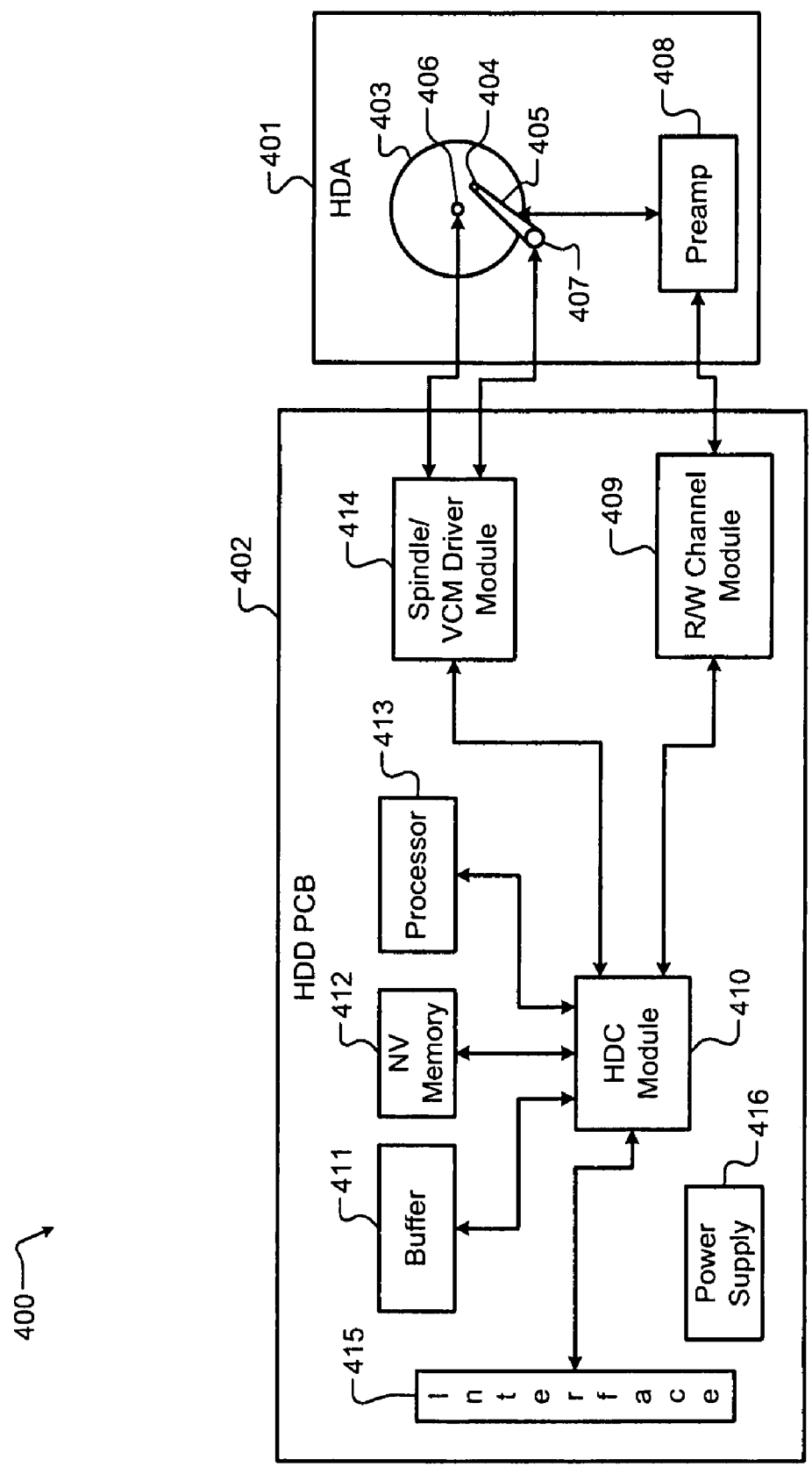
FIG. 9A is a functional block diagram of a hard disk drive.

Referring now to FIGS. 9A-9G, various exemplary implementations incorporating the teachings of the present disclosure are shown. Referring now to FIG. 9A, the teachings of the disclosure can be implemented in memory of a hard disk drive (HDD) 400. The HDD 400 includes a hard disk assembly (HDA) 401 and a HDD PCB 402. The HDA 401 may include a magnetic medium 403, such as one or more platters that store data, and a read/write device 404. The read/write device 404 may be arranged on an actuator arm 405 and may read and write data on the magnetic medium 403. Additionally, the HDA 401 includes a spindle motor 406 that rotates the magnetic medium 403 and a voice-coil motor (VCM) 407 that actuates the actuator arm 405. A preamplifier device 408 amplifies signals generated by the read/write device 404 during read operations and provides signals to the read/write device 404 during write operations.

The HDD PCB 402 includes a read/write channel module (hereinafter, "read channel") 409, a hard disk controller (HDC) module 410, a buffer 411, nonvolatile memory 412, a processor 413, and a spindle/VCM driver module 414. The read channel 409 processes data received from and transmitted to the preamplifier device 408. The HDC module 410 controls components of the HDA 401 and communicates with an external device (not shown) via an I/O interface 415. The external device may include a computer, a multimedia device, a mobile computing device, etc. The I/O interface 415 may include wireline and/or wireless communication links.

The HDC module 410 may receive data from the HDA 401, the read channel 409, the buffer 411, nonvolatile memory 412, the processor 413, the spindle/VCM driver module 414, and/or the I/O interface 415. The processor 413 may process the data, including encoding, decoding, filtering, and/or formatting. The processed data may be output to the HDA 401, the read channel 409, the buffer 411, nonvolatile memory 412, the processor 413, the spindle/VCM driver module 414, and/or the I/O interface 415.

The HDC module 410 may use the buffer 411 and/or nonvolatile memory 412 to store data related to the control and operation of the HDD 400. The buffer 411 may include DRAM, SDRAM, etc. The nonvolatile memory 412 may include flash memory (including NAND and NOR flash memory), phase change memory, magnetic RAM, or multi-state memory, in which each memory cell has more than two states. The spindle/VCM driver module 414 controls the spindle motor 406 and the VCM 407. The HDD PCB 402 includes a power supply 416 that provides power to the components of the HDD 400.

Figure 9B:
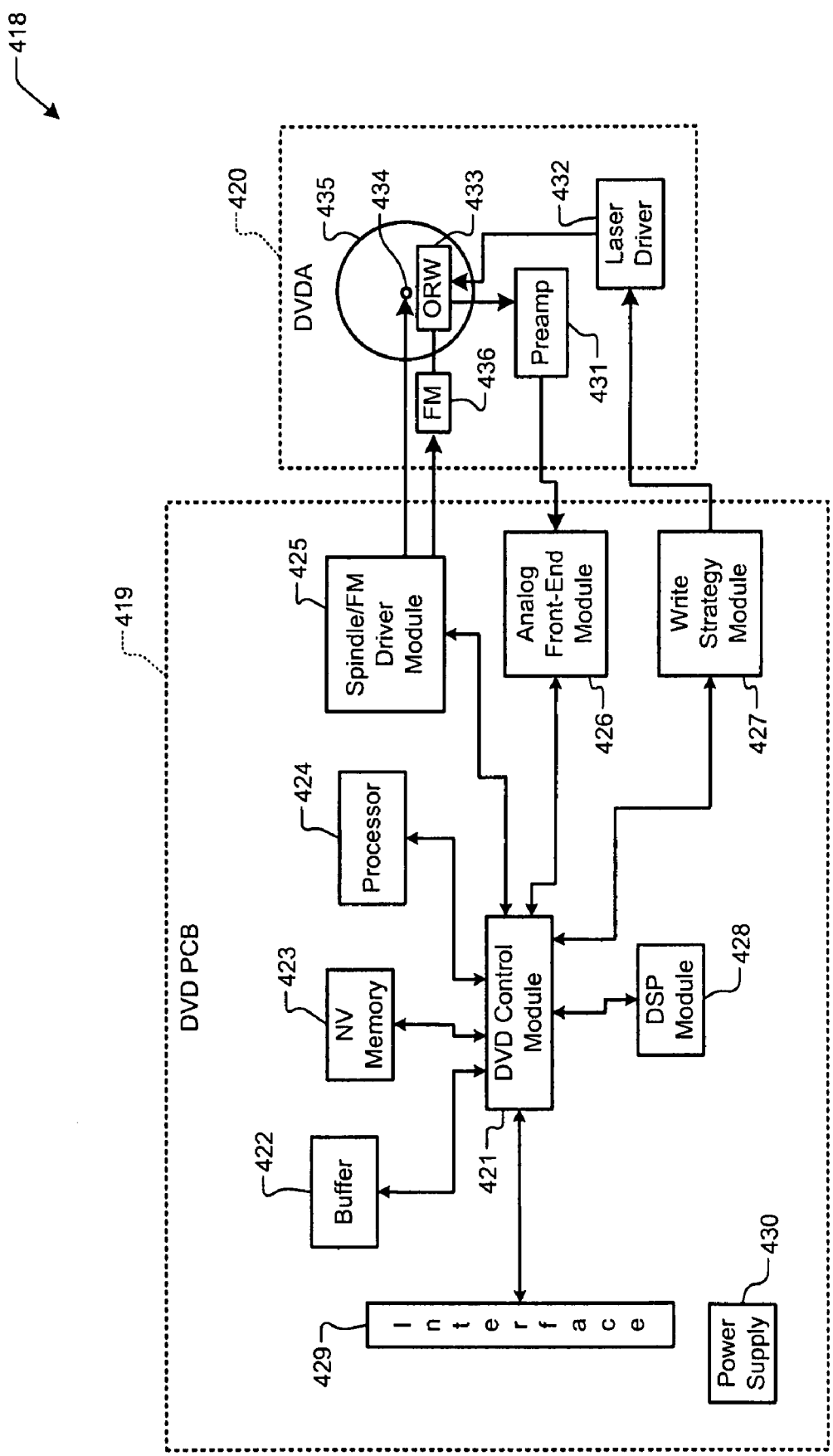
FIG. 9B is a functional block diagram of a DVD drive.

Referring now to FIG. 9B, the teachings of the disclosure can be implemented in memory of a DVD drive 418 or of a CD drive (not shown). The DVD drive 418 includes a DVD PCB 419 and a DVD assembly (DVDA) 420. The DVD PCB 419 includes a DVD control module 421, a buffer 422, nonvolatile memory 423, a processor 424, a spindle/FM (feed motor) driver module 425, an analog front-end module 426, a write strategy module 427, and a DSP module 428.

The DVD control module 421 controls components of the DVDA 420 and communicates with an external device (not shown) via an I/O interface 429. The external device may include a computer, a multimedia device, a mobile computing device, etc. The I/O interface 429 may include wireline and/or wireless communication links.

The DVD control module 421 may receive data from the buffer 422, nonvolatile memory 423, the processor 424, the spindle/FM driver module 425, the analog front-end module 426, the write strategy module 427, the DSP module 428, and/or the I/O interface 429. The processor 424 may process the data, including encoding, decoding, filtering, and/or formatting. The DSP module 428 performs signal processing, such as video and/or audio coding/decoding. The processed data may be output to the buffer 422, nonvolatile memory 423, the processor 424, the spindle/FM driver module 425, the analog front-end module 426, the write strategy module 427, the DSP module 428, and/or the I/O interface 429.

The DVD control module 421 may use the buffer 422 and/or nonvolatile memory 423 to store data related to the control and operation of the DVD drive 418. The buffer 422 may include DRAM, SDRAM, etc. The nonvolatile memory 423 may include flash memory (including NAND and NOR flash memory), phase change memory, magnetic RAM, or multi-state memory, in which each memory cell has more than two states. The DVD PCB 419 includes a power supply 430 that provides power to the components of the DVD drive 418.

The DVDA 420 may include a preamplifier device 431, a laser driver 432, and an optical device 433, which may be an optical read/write (ORW) device or an optical read-only (OR) device. A spindle motor 434 rotates an optical storage medium 435, and a feed motor 436 actuates the optical device 433 relative to the optical storage medium 435.

When reading data from the optical storage medium 435, the laser driver provides a read power to the optical device 433. The optical device 433 detects data from the optical storage medium 435, and transmits the data to the preamplifier device 431. The analog front-end module 426 receives data from the preamplifier device 431 and performs such functions as filtering and A/D conversion. To write to the optical storage medium 435, the write strategy module 427 transmits power level and timing information to the laser driver 432. The laser driver 432 controls the optical device 433 to write data to the optical storage medium 435.

Figure 9D:
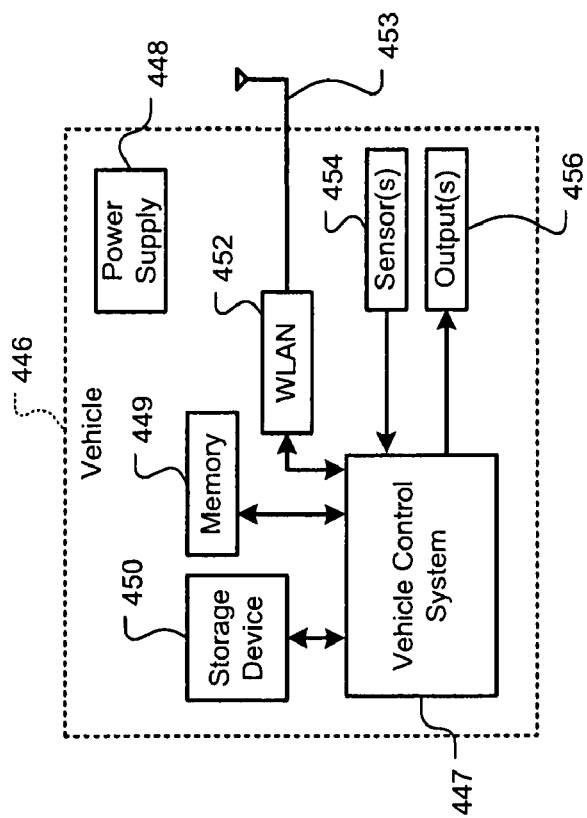
FIG. 9D is a functional block diagram of a vehicle control system.
Figure 9C:
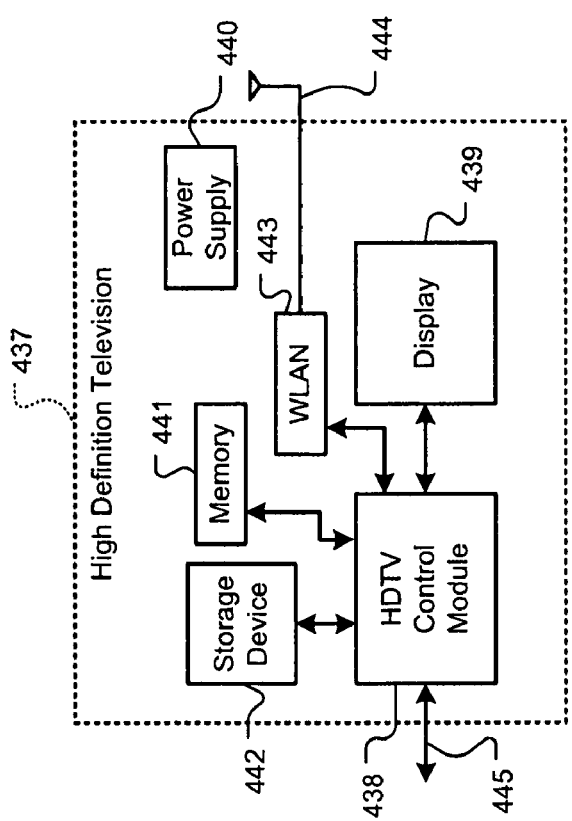
FIG. 9C is a functional block diagram of a high definition television.

Referring now to FIG. 9C, the teachings of the disclosure can be implemented in memory of a high definition television (HDTV) 437. The HDTV 437 includes a HDTV control module 438, a display 439, a power supply 440, memory 441, a storage device 442, a WLAN interface 443 and associated antenna 444, and an external interface 445.

The HDTV 437 can receive input signals from the WLAN interface 443 and/or the external interface 445, which sends and receives information via cable, broadband Internet, and/or satellite. The HDTV control module 438 may process the input signals, including encoding, decoding, filtering, and/or formatting, and generate output signals. The output signals may be communicated to one or more of the display 439, memory 441, the storage device 442, the WLAN interface 443, and the external interface 445.

Memory 441 may include random access memory (RAM) and/or nonvolatile memory such as flash memory, phase change memory, or multi-state memory, in which each memory cell has more than two states. The storage device 442 may include an optical storage drive, such as a DVD drive, and/or a hard disk drive (HDD). The HDTV control module 438 communicates externally via the WLAN interface 443 and/or the external interface 445. The power supply 440 provides power to the components of the HDTV 437.

Referring now to FIG. 9D, the teachings of the disclosure may be implemented in memory of a vehicle 446. The vehicle 446 may include a vehicle control system 447, a power supply 448, memory 449, a storage device 450, and a WLAN interface 452 and associated antenna 453. The vehicle control system 447 may be a powertrain control system, a body control system, an entertainment control system, an anti-lock braking system (ABS), a navigation system, a telematics system, a lane departure system, an adaptive cruise control system, etc.

The vehicle control system 447 may communicate with one or more sensors 454 and generate one or more output signals 456. The sensors 454 may include temperature sensors, acceleration sensors, pressure sensors, rotational sensors, airflow sensors, etc. The output signals 456 may control engine operating parameters, transmission operating parameters, suspension parameters, etc.

The power supply 448 provides power to the components of the vehicle 446. The vehicle control system 447 may store data in memory 449 and/or the storage device 450. Memory 449 may include random access memory (RAM) and/or nonvolatile memory such as flash memory, phase change memory, or multi-state memory, in which each memory cell has more than two states. The storage device 450 may include an optical storage drive, such as a DVD drive, and/or a hard disk drive (HDD). The vehicle control system 447 may communicate externally using the WLAN interface 452.

Figure 9F:
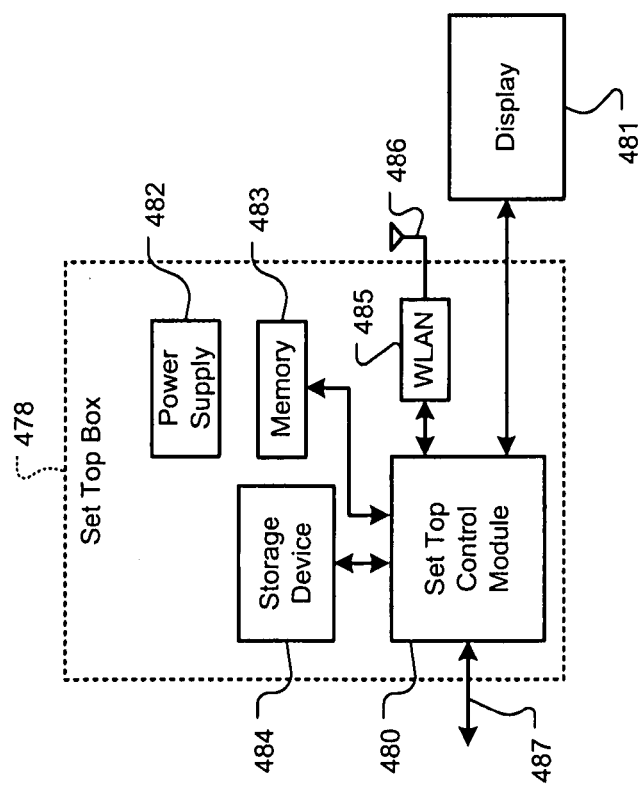
FIG. 9F is a functional block diagram of a set top box.
Figure 9E:
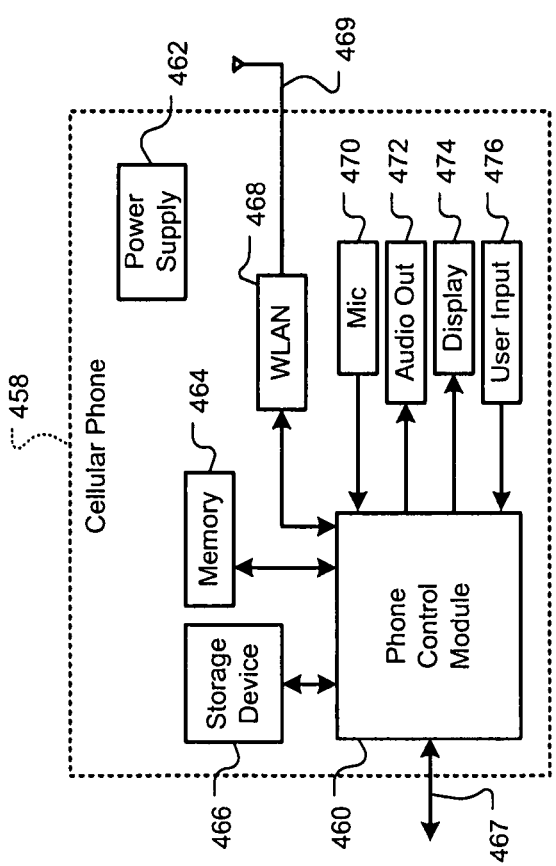
FIG. 9E is a functional block diagram of a cellular phone.

Referring now to FIG. 9E, the teachings of the disclosure can be implemented in memory of a cellular phone 458. The cellular phone 458 includes a phone control module 460, a power supply 462, memory 464, a storage device 466, and a cellular network interface 467. The cellular phone 458 may include a WLAN interface 468 and associated antenna 469, a microphone 470, an audio output 472 such as a speaker and/or output jack, a display 474, and a user input device 476 such as a keypad and/or pointing device.

The phone control module 460 may receive input signals from the cellular network interface 467, the WLAN interface 468, the microphone 470, and/or the user input device 476. The phone control module 460 may process signals, including encoding, decoding, filtering, and/or formatting, and generate output signals. The output signals may be communicated to one or more of memory 464, the storage device 466, the cellular network interface 467, the WLAN interface 468, and the audio output 472.

Memory 464 may include random access memory (RAM) and/or nonvolatile memory such as flash memory, phase change memory, or multi-state memory, in which each memory cell has more than two states. The storage device 466 may include an optical storage drive, such as a DVD drive, and/or a hard disk drive (HDD). The power supply 462 provides power to the components of the cellular phone 458.

Referring now to FIG. 9F, the teachings of the disclosure can be implemented in memory of a set top box 478. The set top box 478 includes a set top control module 480, a display 481, a power supply 482, memory 483, a storage device 484, and a WLAN interface 485 and associated antenna 486.

The set top control module 480 may receive input signals from the WLAN interface 485 and an external interface 487, which can send and receive information via cable, broadband Internet, and/or satellite. The set top control module 480 may process signals, including encoding, decoding, filtering, and/or formatting, and generate output signals. The output signals may include audio and/or video signals in standard and/or high definition formats. The output signals may be communicated to the WLAN interface 485 and/or to the display 481. The display 481 may include a television, a projector, and/or a monitor.

The power supply 482 provides power to the components of the set top box 478. Memory 483 may include random access memory (RAM) and/or nonvolatile memory such as flash memory, phase change memory, or multi-state memory, in which each memory cell has more than two states. The storage device 484 may include an optical storage drive, such as a DVD drive, and/or a hard disk drive (HDD).

Figure 9G:
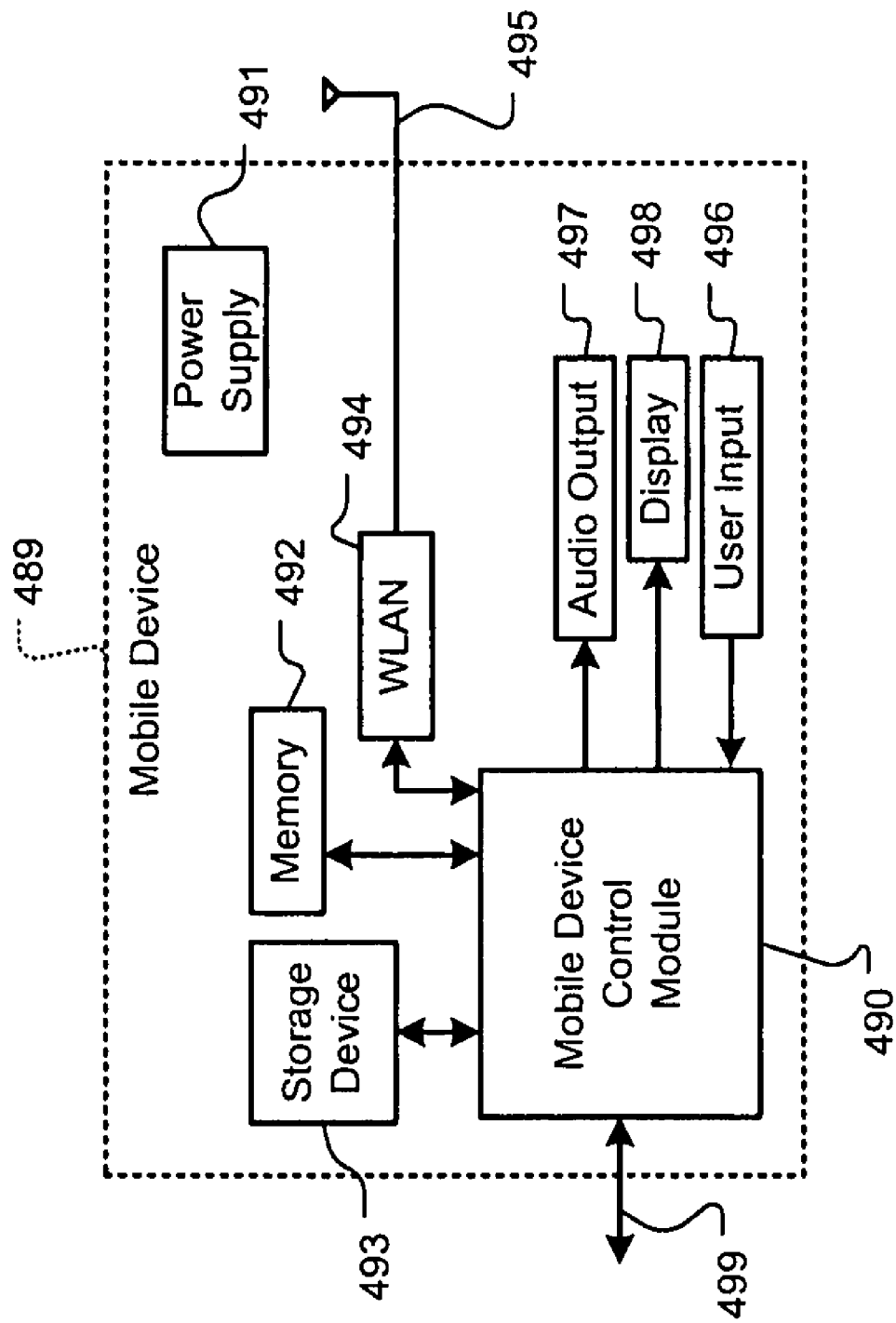
FIG. 9G is a functional block diagram of a mobile device.

Referring now to FIG. 9G, the teachings of the disclosure can be implemented in memory of a mobile device 489. The mobile device 489 may include a mobile device control module 490, a power supply 491, memory 492, a storage device 493, a WLAN interface 494 and associated antenna 495, and an external interface 499.

The mobile device control module 490 may receive input signals from the WLAN interface 494 and/or the external interface 499. The external interface 499 may include USB, infrared, and/or Ethernet. The input signals may include compressed audio and/or video, and may be compliant with the MP3 format. Additionally, the mobile device control module 490 may receive input from a user input 496 such as a keypad, touchpad, or individual buttons. The mobile device control module 490 may process input signals, including encoding, decoding, filtering, and/or formatting, and generate output signals.

The mobile device control module 490 may output audio signals to an audio output 497 and video signals to a display 498. The audio output 497 may include a speaker and/or an output jack. The display 498 may present a graphical user interface, which may include menus, icons, etc. The power supply 491 provides power to the components of the mobile device 489. Memory 492 may include random access memory (RAM) and/or nonvolatile memory such as flash memory, phase change memory, or multi-state memory, in which each memory cell has more than two states. The storage device 493 may include an optical storage drive, such as a DVD drive, and/or a hard disk drive (HDD). The mobile device may include a personal digital assistant, a media player, a laptop computer, a gaming console or other mobile computing device.

Those skilled in the art can now appreciate from the foregoing description that the broad teachings of the disclosure can be implemented as a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A phase change memory system comprising:
   M phase change memory cells, where M is an integer greater than or equal to one;
   a write module that selectively writes at least one of said M phase change memory cells based on a write parameter;
   a read module that selectively reads back a resistance value for said at least one of said M phase change memory cells; and
   a control module that communicates with said write module and said read module, that triggers write/read cycles N times where N is an integer greater than one, and that adjusts a write parameter of one of said N write/read cycles based on at least one prior resistance value and a target resistance value.

2. The phase change memory system of claim 1 wherein said control module comprises an estimation module that generates an $N^{th}$ write parameter based on N−1 resistance values corresponding to N−1 of said N write/read cycles and said target resistance value, and where N is greater than two.

3. The phase change memory system of claim 2 wherein said estimation module interpolates an $N^{th}$ write parameter based on N−1 resistance values corresponding to N−1 of said N write/read cycles and said target resistance value, and where N is greater than two.

4. The phase change memory system of claim 2 wherein said estimation module extrapolates an $N^{th}$ write parameter based on N−1 resistance values corresponding to N−1 of said N write/read cycles and said target resistance value, and where N is greater than two.

5. The phase change memory system of claim 2 wherein said estimation module generates a second write parameter for a second one of said write/read cycles based on a difference between a first resistance value from a first one of said write/read cycles and said target resistance value.

6. The phase change memory system of claim 5 wherein said estimation module interpolates a subsequent resistance value based on said difference, a gradient value of said at least one of said M phase change memory cells, and said target resistance value.

7. The phase change memory system of claim 5 wherein said estimation module extrapolates said target resistance value based on said difference, a gradient value of said at least one of said M phase change memory cells, and said target resistance value.

8. The phase change memory system of claim 1 wherein said read module further comprises a read back amplifier module.

9. The phase change memory system of claim 8 wherein said read back amplifier module has a substantially logarithmic response.

10. The phase change memory system of claim 1 wherein said control module sets a write parameter of another one of said M phase change memory cells based on a last one of said write parameters for said at least one of said M phase change memory cells.

11. The phase change memory system of claim 1 wherein said write module writes said at least one of said phase change memory cells using a first write profile that heats said at least one of said phase change memory cells above a melting temperature, decreases temperature of said at least one of said phase change memory cells below a crystallization temperature that is below said melting temperature, heats said at least one of said phase change memory cells to said crystallization temperature, and maintains said crystallization temperature for a first time period.

12. The phase change memory system of claim 11 wherein said first time period of said first write profile corresponds to a first resistance value above said target resistance value.

13. The phase change memory system of claim 12 wherein said control module adjusts said first time period in a second write profile to provide a second resistance value below said first resistance value and above said target resistance value.

14. The phase change memory system of claim 13 wherein said control module bases at least one of said write parameters on said first time period of said first and said second write profiles.

15. The phase change memory system of claim 1 wherein said control module incrementally decreases a resistance value of said at least one of said phase-change memory cells based on said target resistance value using X current pulses, where X is an integer greater than one.

16. The phase change memory system of claim 1 wherein said write parameters of said N write/read cycles correspond to N different crystallization times.

17. The phase change memory system of claim 1 wherein said write parameters of said N write/read cycles correspond to N different crystallization temperatures.

18. A method for storing data in phase change memory comprising:
   selectively writing at least one of said M phase change memory cells based on a write parameter, where M is an integer greater than or equal to one;
   selectively reading back a resistance value for said at least one of said M phase change memory cells;
   triggering write/read cycles N times where N is an integer greater than one; and adjusting a write parameter of one of said N write/read cycles based on at least one prior resistance value and a target resistance value.

19. The method of claim 18 further comprising generating an $N^{th}$ write parameter based on N−1 resistance values corresponding to N−1 of said N write/read cycles and said target resistance value, where N is greater than two.

20. The method of claim 19 further comprising interpolating said $N^{th}$ write parameter based on N−1 resistance values corresponding to N−1 of said N write/read cycles and said target resistance value.

21. The method of claim 19 further comprising extrapolating said $N^{th}$ write parameter based on N−1 resistance values corresponding to N−1 of said N write/read cycles and said target resistance value.

22. The method of claim 19 further comprising generating a second write parameter for a second one of said write/read cycles based on a difference between a first resistance value from a first one of said write/read cycles and said target resistance value.

23. The method of claim 22 further comprising interpolating a subsequent resistance value based on said difference, a gradient value of said at least one of said M phase change memory cells, and said target resistance value.

24. The method of claim 22 further comprising extrapolating said target resistance value based on said difference, a gradient value of said at least one of said M phase change memory cells, and said target resistance value.

25. The method of claim 18 further comprising setting a write parameter of another one of said M phase change memory cells based on a last one of said write parameters for said at least one of said M phase change memory cells.

26. The method of claim 18 further comprising:
heating said at least one of said phase change memory cells above a melting temperature;
decreasing temperature of said at least one of said phase change memory cells below a crystallization temperature that is below said melting temperature;
heating said at least one of said phase change memory cells to said crystallization temperature; and
maintaining said crystallization temperature for a first time period.

27. The method of claim 26 further comprising adjusting said first time period in a second write profile to provide a second resistance value below a first resistance value and above said target resistance value, wherein said first time period of said first write profile corresponds to said first resistance value above said target resistance value.

28. The method of claim 27 further comprising generating at least one of said write parameters based on said first time period of said first and said second write profiles.

29. The method of claim 18 further comprising incrementally decreasing a resistance value of said at least one of said phase-change memory cells based on said target resistance value using X current pulses, where X is an integer greater than one.

* * * * *

UNITED STATES PATENT AND TRADEMARK OFFICE
CERTIFICATE OF CORRECTION

PATENT NO. : 7,423,901 B2 Page 1 of 1
APPLICATION NO. : 11/701338
DATED : September 9, 2008
INVENTOR(S) : Pantas Sutardja It is certified that error appears in the above-identified patent and that said Letters Patent is hereby corrected as shown below:

Column 6, Line 18   Delete "maybe" and insert -- may be --

Signed and Sealed this

Second Day of December, 2008

JON W. DUDAS
*Director of the United States Patent and Trademark Office*